United States Patent
Schultz

(10) Patent No.: US 7,529,993 B1
(45) Date of Patent: May 5, 2009

(54) METHOD OF SELECTIVELY PROGRAMMING INTEGRATED CIRCUITS TO COMPENSATE FOR PROCESS VARIATIONS AND/OR MASK REVISIONS

(75) Inventor: David P. Schultz, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 418 days.

(21) Appl. No.: 11/449,172

(22) Filed: Jun. 8, 2006

(51) Int. Cl.
*G01R 31/28* (2006.01)

(52) U.S. Cl. ..................................... 714/725
(58) Field of Classification Search ................. 714/725
See application file for complete search history.

(56) References Cited

U.S. PATENT DOCUMENTS

| | | | |
|---|---|---|---|
| 5,589,783 A | 12/1996 | McClure | |
| 6,094,702 A * | 7/2000 | Williams et al. | 711/101 |
| 6,177,819 B1 | 1/2001 | Nguyen | |
| 6,236,231 B1 | 5/2001 | Nguyen et al. | |
| 6,476,638 B1 | 11/2002 | Zhou et al. | |
| 6,996,727 B1 * | 2/2006 | Snyder et al. | 713/300 |
| 7,020,764 B2 | 3/2006 | Kubota et al. | |
| 7,064,582 B2 | 6/2006 | Gallo et al. | |
| 7,215,150 B2 | 5/2007 | Torres et al. | |
| 7,227,390 B1 | 6/2007 | Bapat et al. | |
| 7,248,083 B2 | 7/2007 | Chung | |
| 7,334,173 B2 * | 2/2008 | Morgan et al. | 714/726 |
| 7,355,453 B2 * | 4/2008 | Watt | 326/87 |
| 2004/0113654 A1 * | 6/2004 | Lundberg | 326/30 |
| 2005/0261797 A1 * | 11/2005 | Cyr et al. | 700/121 |
| 2006/0033532 A1 * | 2/2006 | Watt | 326/87 |
| 2006/0119384 A1 | 6/2006 | Camarota et al. | |
| 2007/0040577 A1 | 2/2007 | Lewis et al. | |

OTHER PUBLICATIONS

U.S. Appl. No. 11/449,198, filed Jun. 8, 2006, Rahman.
U.S. Appl. No. 11/449,202, filed Jun. 8, 2006, Rahman.
U.S. Appl. No. 11/449,203, filed Jun. 8, 2006, Rahman.
U.S. Appl. No. 11/449,240, filed Jun. 8, 2006, Schultz.
Arifur Rahman et al.; "Heterogeneous Routing Architecture for Low-Power FPGA Fabric"; IEEE 2005 Custom Integrated Circuits Conference; Copyright 2005 IEEE; pp. 183-186.

* cited by examiner

*Primary Examiner*—James C Kerveros
(74) *Attorney, Agent, or Firm*—Lois D. Cartier; LeRoy D. Maunu

(57) ABSTRACT

Methods of compensating for process variations and/or mask revisions in a programmable integrated circuit (IC). A non-volatile memory in the IC stores a value representing a process corner and/or mask revision for the IC. A configuration control circuit monitors a configuration bitstream provided to the programmable IC. When no code key is received, configuration data is applied to a first (e.g., digital) circuit. When a code key is identified, the code key is compared to the stored value. If there is a match, the subsequent configuration data is applied to a second (e.g., analog) circuit. If there is no match, the subsequent configuration data is ignored until an "unlock" command is detected in the bitstream. Thus, the configuration data for the digital circuit need be included only once in the bitstream, while the configuration data for the analog circuit is supplied once for each supported process corner or mask revision.

20 Claims, 6 Drawing Sheets

METHOD OF SELECTIVELY PROGRAMMING INTEGRATED CIRCUITS TO COMPENSATE FOR PROCESS VARIATIONS AND/OR MASK REVISIONS

FIELD OF THE INVENTION

The invention relates to programmable integrated circuits (ICs). More particularly, the invention relates to methods of selectively programming a programmable IC to compensate for process variations and/or mask revisions among IC dice.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), multi-gigabit transceivers (MGTs), and so forth. Many of these tiles include circuits that are sensitive to variations in the silicon manufacturing process. With the decreasing physical geometries of transistors, resistors, capacitors, and other elements in integrated circuits, these process variations are becoming more difficult to compensate for using traditional design techniques.

Sometimes mask revisions are necessary to adjust circuits for process variations, and sometimes mask revisions are made for other reasons. In either case, mask revisions for a PLD can include changes to the values and/or usage of configuration data bits. Current methods of dealing with such mask revisions often require that a PLD user manually generate different bitstreams for different mask revisions of a PLD.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable. Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell. The terms "PLD", "programmable logic device", and "programmable integrated circuit" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

FIG. 2 illustrates an exemplary analog circuit including a bias generator 210 and an analog sub-circuit 220 driven by the bias generator. This type of circuit can be included, for example, in the analog logic blocks (IO blocks, MGTs, and so forth) of the FPGA of FIG. 1. In this example, analog sub-circuit 220 is a CML buffer (a current mode logic buffer), but other types of circuitry can also be driven by bias generator 210. CML buffer 220 is a well-known differential circuit typically used for high-speed logic. For example, a differential input signal that includes the two complementary signals IN and IN_B drives CML buffer 220, which produces the two complementary output signals OUT and OUT_B. CML buffer 220 includes resistors 221 and 222 and N-channel transistors 223-225, coupled between power high VDD and ground GND as shown in FIG. 2. NMOS transistor 225 generates the tail current for CML buffer 220, and is driven by a bias voltage Vbias, which is generated by bias generator 210. (In the present specification, the same reference characters are used to refer to terminals, signal lines, and their corresponding signals.) The value of bias voltage Vbias determines the current drive and voltage swing of CML buffer 220.

Bias generator 210 includes a P-channel pull-up transistor 201 gated by a reference voltage Vref, and two diode-connected NMOS transistors 202-203, coupled together between power high VDD and ground GND as shown in FIG. 2. Note that transistors 202 and 203 are coupled in parallel. As will be clear to those of skill in the art, the number of pull-down transistors can be less than two, two, or greater than two, and the size of the transistors can also vary, as determined by the circuit requirements of the Vbias node. For example, the Vbias node can drive only one destination (e.g., CML buffer 220, as shown), or can drive many destinations (e.g., many copies of buffer 220). The loading on the node is one of many factors that can affect the size and number of transistors 202-203. Other factors can include, for example, the operating voltage of the circuit. Additionally, the operating characteristics of bias generator 210 are typically affected by the process corner of the die including the circuit.

During the fabrication process for integrated circuits, it is very difficult to ensure complete uniformity for all die. For example, the width of minimum-size metal lines and polysilicon lines may vary from lot to lot, from wafer to wafer, or between dice at different locations on the same wafer. The thickness of some features (e.g., oxide layers) may also vary from lot to lot, from wafer to wafer, or between dice at different locations on the same wafer. Further, when an IC product is manufactured by more than one processing facility, these variations may be more pronounced, and/or may include differences in materials as well as feature size or thickness. These process variations may lead to differences in performance and/or other operating characteristics among various IC die.

Die are typically tested and sorted into different categories based on these characteristics. One common sorting technique is to characterize ICs as either slow, typical, or fast devices. These categories are examples of the different "process corners". A process corner designation may be applied to an entire device, or to a specific type of structure (e.g., an N-channel transistor, a P-channel transistor, a thick oxide transistor, a low threshold transistor, a polysilicon resistor, and so forth). Thus, an IC die may fall into a single process corner, or more than one process corner.

The process corner(s) of an integrated circuit may seriously affect the performance of analog circuitry such as the bias generator circuit 210 shown in FIG. 2. For example, bias generator circuit 210 may generate a different bias voltage Vbias at the slow corner than at the fast corner of the process. Alternatively or additionally, the amount of capacitance that can be driven by bias generator circuit 210, or the speed of operation of the circuits driven by bias generator circuit 210, may vary unacceptably. These effects can be sufficient to make it very difficult to design a bias circuit 210 that will ensure optimum performance from CML buffer 220 at all process corners, particularly given the smaller feature sizes envisioned for future integrated circuits.

Therefore, it is desirable to provide circuits and methods of compensating for process variations and/or mask revisions in integrated circuits.

SUMMARY OF THE INVENTION

The invention provides circuits and methods of compensating for process variations and/or mask revisions in a programmable integrated circuit (IC). An exemplary programmable IC includes two programming ports, two programmable circuits (e.g., a digital circuit and an analog circuit), a non-volatile memory, and a configuration control circuit coupled to the programmable circuits and the non-volatile memory. In some embodiments, one programming port can be used for storing data in the non-volatile memory, while the other port can be used for providing a configuration bitstream to the configuration control circuit. The non-volatile memory can be used to store a value that identifies one or more process corners and/or one or more mask revisions for the programmable IC.

According to one embodiment, the configuration control circuit monitors data arriving in the configuration bitstream. When no code key has been received, configuration data is applied to a first circuit, e.g., a digital circuit. When a code key is identified in the configuration bitstream, the code key is compared to the value stored in the non-volatile memory. If there is a match, the subsequent configuration data is applied to a second circuit, e.g., an analog circuit. If there is no match, the subsequent configuration data is ignored until an "unlock" command is detected in the configuration bitstream. Thus, the configuration data for the digital circuit need be included only once in the configuration bitstream, while the typically smaller amount of configuration data for the analog circuit is supplied once for each supported process corner or mask revision.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of programmable integrated circuits (ICs). An appreciation of the present invention is presented by way of specific examples utilizing programmable logic devices (PLDs) such as field programmable gate arrays (FPGAs). However, the present invention is not limited by these examples.

Figure 2:
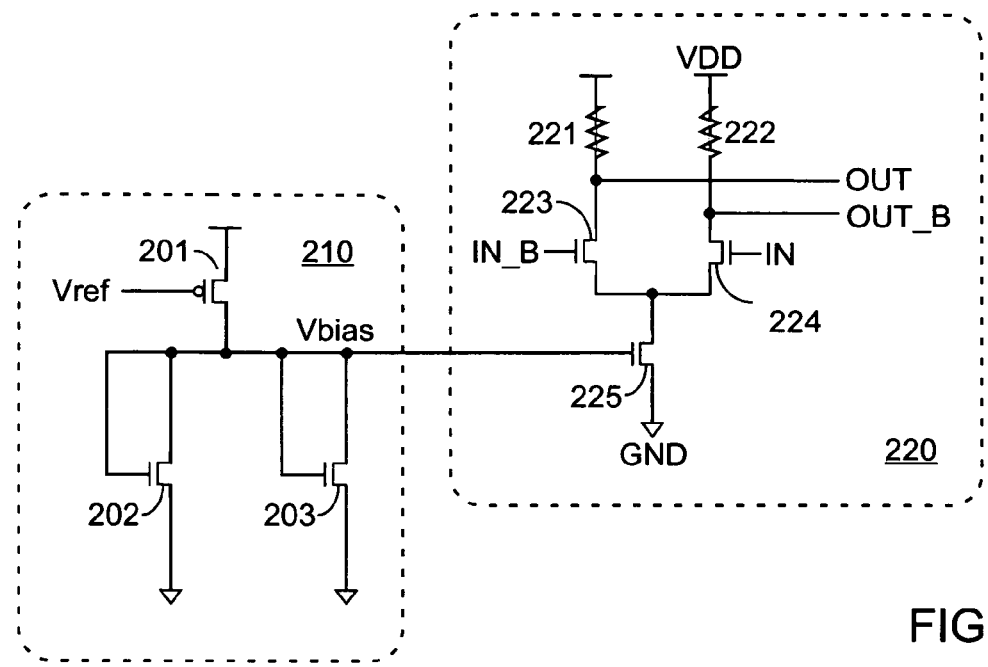
FIG. 2 is a schematic diagram of a known analog circuit including a bias generator and a current mode logic (CML) buffer.
Figure 3:
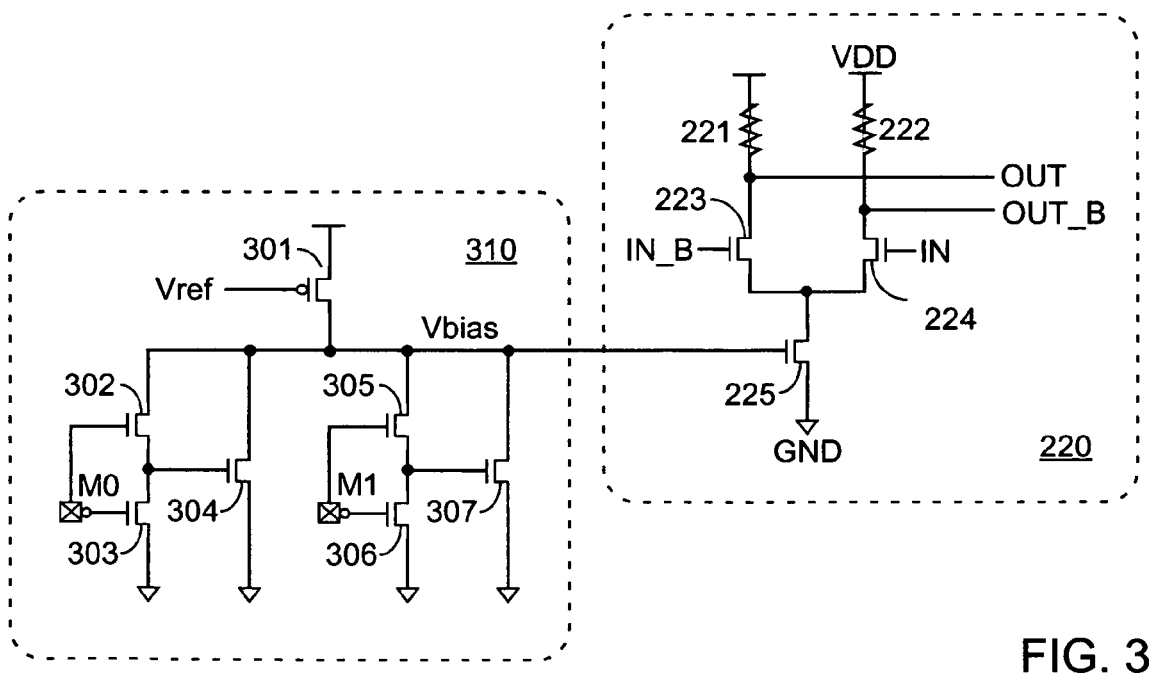
FIG. 3 is a schematic diagram of a programmable analog circuit that can be used, for example, with the present invention.

FIG. 3 illustrates an analog circuit similar to the known circuit shown in FIG. 2. However, the circuit of FIG. 3 is programmable to generate more than one different value of the bias voltage Vbias. This programmable circuit can be used, for example, to implement the present invention.

The circuit of FIG. 3 includes an exemplary analog circuit including a programmable bias generator 310 and an analog sub-circuit 220 driven by the bias generator. In the illustrated example, analog sub-circuit 220 is the same circuit as the CML buffer of FIG. 2. To avoid repetition, this circuit is not again described. Note that the bias voltage Vbias can be applied to any circuit that benefits from the use of a bias voltage. Therefore, the inclusion of the illustrated CML buffer in FIG. 3 is purely exemplary.

Programmable bias generator 310 includes a P-channel pull-up transistor 301 gated by a reference voltage Vref, two configuration memory cells M0 and M1, and six N-channel transistors 302-307, coupled together between power high VDD and ground GND as shown in FIG. 3.

Transistor 304 corresponds to transistor 202 of FIG. 2. However, the gate of transistor 304 is controlled by transistors 302 and 303, which are in turn controlled by configuration memory cell M0. When a high value is stored in configuration memory cell M0, transistor 302 is on and transistor 303 is off (the "bubble" between memory cell M0 and transistor 303 signifies an inversion). The gate of transistor 304 is tied to the Vbias node. Therefore, transistor 304 behaves in the same fashion as transistor 202 of FIG. 2. When a low value is stored in configuration memory cell M0, transistor 302 is off and transistor 303 is on. The gate of transistor 304 is tied to ground GND, so transistor 304 is turned off. Hence, the value stored in configuration memory cell M0 either enables or disables pull-down transistor 304.

Similarly, transistor 307 corresponds to transistor 203 of FIG. 2. However, the gate of transistor 307 is controlled by transistors 305 and 306, which are in turn controlled by configuration memory cell M1. When a high value is stored in configuration memory cell M1, transistor 305 is on and transistor 306 is off, and transistor 307 behaves in the same fashion as transistor 203 of FIG. 2. When a low value is stored in configuration memory cell M1, transistor 305 is off and transistor 306 is on, so transistor 307 is turned off. Hence, the value stored in configuration memory cell M1 either enables or disables pull-down transistor 307.

Note that transistors 304 and 307 do not necessarily have to be the same size, although in some embodiments they are the same size. By using two differently sized pull-down transistors, the number of values of Vbias is increased to three: transistors 304 and 307 both enabled; transistor 304 enabled and transistor 307 disabled; and transistor 304 disabled while transistor 307 is enabled. Thus, this arrangement can be used, for example, to adapt programmable bias generator 310 to three different process corners, e.g., slow, typical, and fast.

As will be clear to those of skill in the art, the number of pull-down transistors can be greater than two, if desired, and the sizes of the transistors can also vary, as determined by the circuit requirements of the Vbias node. For example, the Vbias node can drive only one destination (e.g., CML buffer 220, as shown), or can drive many destinations (e.g., many copies of buffer 220). The loading on the node is one of many factors that can affect the size and number of transistors 304 and 307. Other factors can include, for example, the operating voltage of the circuit.

Figure 4:
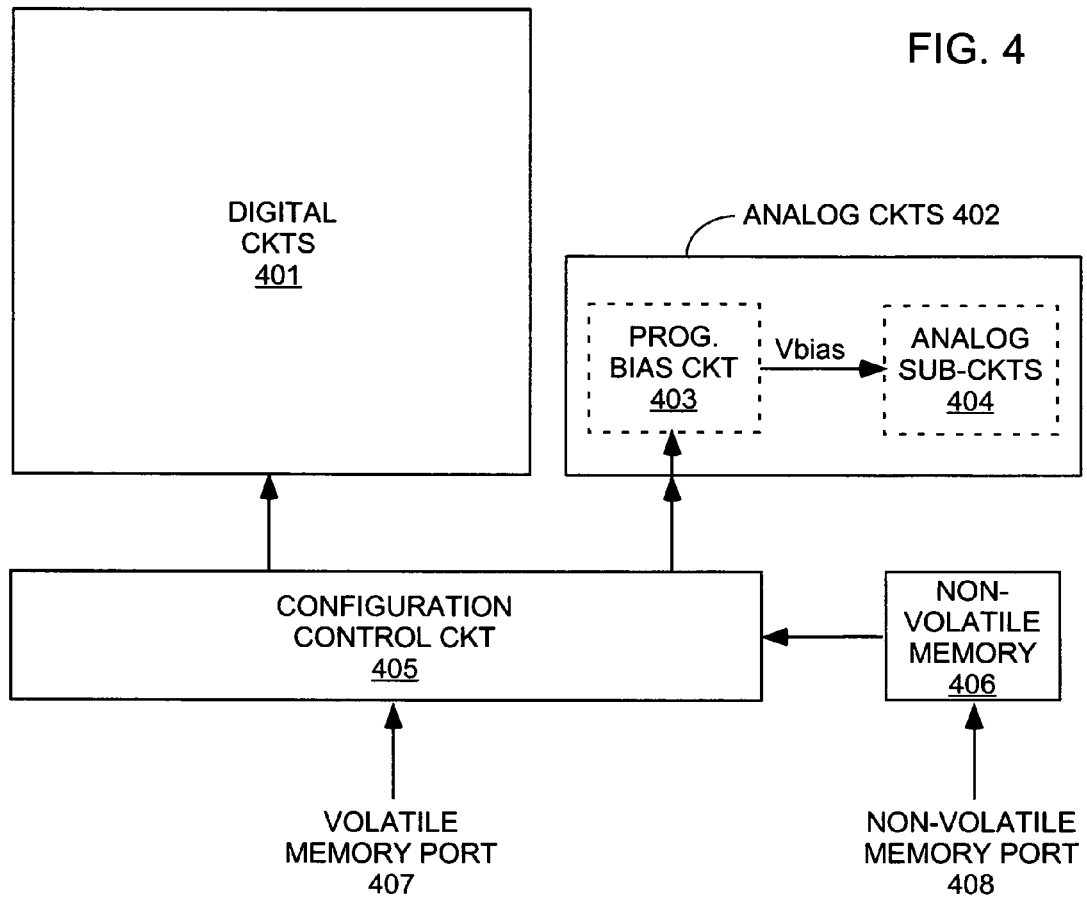
FIG. 4 is a block diagram of a programmable integrated circuit (IC) implemented according to one aspect of the present invention.

FIG. 4 is a block diagram of a programmable integrated circuit (IC) implemented according to one aspect of the present invention. The programmable IC of FIG. 4 includes digital circuits 401, analog circuits 402, and a configuration control circuit 405 that provides configuration data to digital circuits 401 and analog circuits 402. A volatile memory port 407 provides an input port for a configuration bitstream that provides the configuration data to configuration control circuit 405. A non-volatile memory port 408 provides access for programming data (e.g., a value representing a process corner for the programmable IC), by which the value can be written to non-volatile memory 406. The value stored in non-volatile memory 406 is provided to configuration control circuit 405, where it can be used, for example, to determine which data from the configuration bitstream should be used to program analog circuits 402.

Non-volatile memory 406 can be implemented, for example, using an E-fuse structure, in which one or more fuses are blown to connect internal nodes to power high or ground. Alternatively or additionally, non-volatile memory 406 can be implemented using a PROM cell, an EPROM cell, and EEPROM cell, and/or a FLASH memory cell. It will be apparent to those of skill in the art that other types of non-volatile memory can also be used, including non-volatile memory structures yet to be developed.

Figure 1:
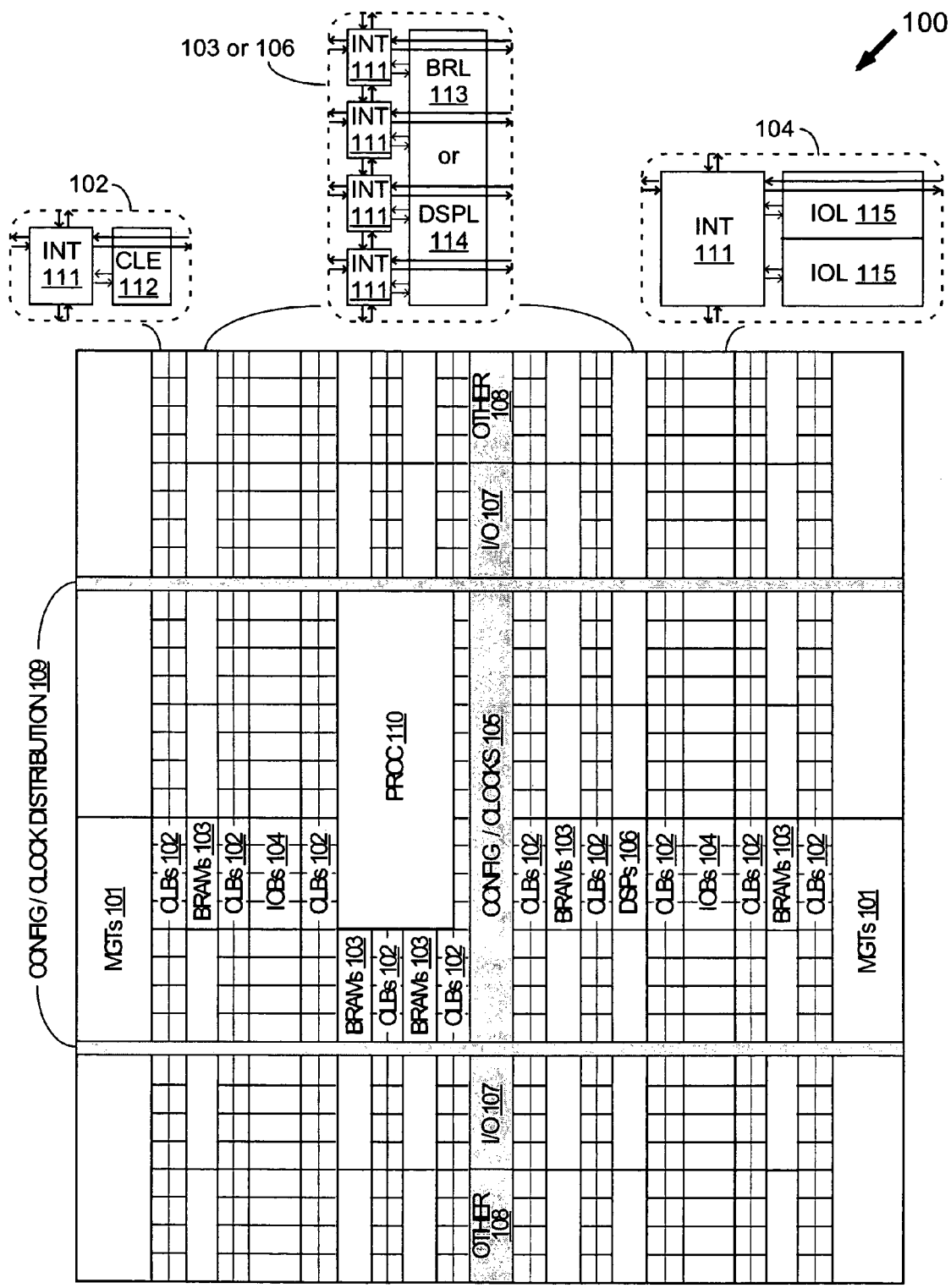
FIG. 1 is an architectural representation of a known field programmable gate array (FPGA).

Analog circuits 402 can include, for example, a programmable bias generator circuit 403 and analog sub-circuits 404, as shown in FIG. 4. Analog circuits 402 can be implemented, for example, as shown in FIG. 3. Additionally or alternatively, analog circuits 402 can include, for example, operational amplifiers, voltage reference circuits, voltage regulator circuits, differential to single-ended converter circuits, and/or memory cell read/write circuits. In a field programmable gate array having a structure similar to the FPGA shown in FIG. 1, for example, analog circuits 402 can include any or all of the following logic blocks: input/output blocks (IOBs); multi-gigabit transceivers (MGTs); digital clock managers (DCMs); digitally controlled impedance (DCI) circuitry; system monitors; analog-to-digital (A/D) converters; and so forth.

For simplicity, the programmable IC of FIG. 4 illustrates an example in which the two types of programmable circuits 401, 402 are divided into digital circuits and analog circuits. This might be the case, for example, when the methods and circuits of the invention are used to compensate for process variations that typically have a greater effect on analog circuitry than on digital circuitry. In other embodiments (not shown), one or both types of circuitry include both digital and analog circuitry, or both circuits include only digital logic, or both circuits include only analog logic. For example, when the methods and circuits of the invention are used to compensate for mask revisions, the mask revisions might affect digital circuitry as well as, or instead of, analog circuitry.

Note further that while these circuits are shown in FIG. 4 as being physically distinct from one another, they may be implemented either as physically distinct circuits or they can be physically interspersed with one another. For example, configuration control circuit 405 may be dispersed among the digital and/or analog circuitry.

Figure 5:
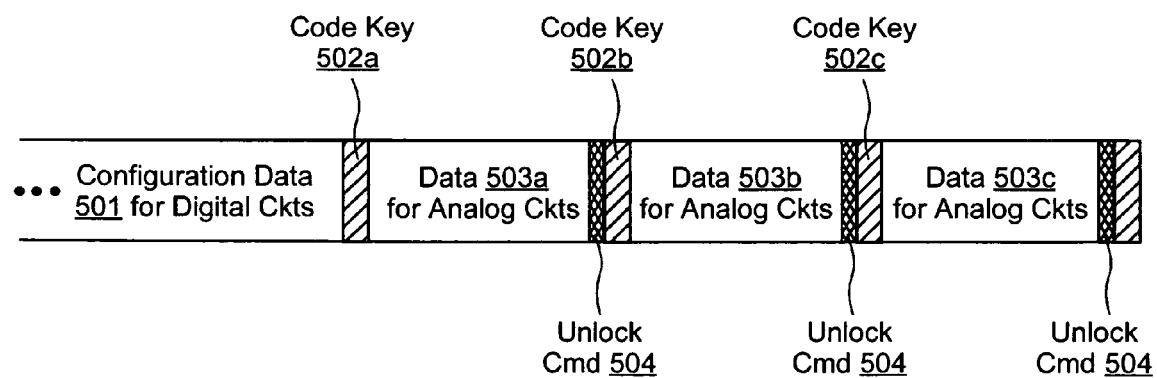
FIG. 5 illustrates a configuration bitstream that can be used, for example, in the novel processes described herein.

FIG. 5 illustrates a configuration bitstream that can be used, for example, to implement the present invention. The configuration bitstream of FIG. 5 is written onto a programmable IC from left to right. Thus, the first data to be written to the programmable IC in the illustrated example is the configuration data 501 for the digital circuits. For example, in the programmable IC of FIG. 4, configuration control circuit 405 would write this data to digital circuits 401. After the digital data, the configuration bitstream includes a code key 502a which is detected by configuration control circuit 405. Configuration control circuit 405 then compares this code key 502a to a value stored in non-volatile memory 406. When the two values match, configuration control circuit 405 stores the subsequent data 503a into analog circuits 402. When the two values do not match, configuration control circuit 405 ignores the subsequent data 503a, and continues monitoring the configuration bitstream. In either case, when an "unlock" command 504 is detected, the first set of analog configuration data is complete. Another code key 502b indicates the beginning of another set of the analog configuration data 503b, and another instance of unlock command 504 signals the end of the second set of analog configuration data. A third code key 502c indicates the beginning of another set of the analog configuration data 503c, and another instance of unlock command 504 signals the end of the third set of analog configuration data. When the third set of analog configuration data 503c occurs at the end of the configuration bitstream, as shown in FIG. 5, the final occurrence of unlock command 504 is optional.

As is well known, configuration bitstreams are typically organized into "frames" of data, e.g., with each frame having the same width as an internal configuration register within the programmable IC. In these embodiments, clearly it is preferable to organize the configuration data within the bitstream such that the code keys and unlock commands are inserted at frame boundaries. However, in some embodiments the code keys and/or unlock commands are inserted at locations other than frame boundaries. In some such embodiments, the configuration data is not organized into frames. In other such embodiments, the configuration data is organized into frames, but the code keys and/or unlock commands are inserted at locations other than frame boundaries.

The configuration bitstream of FIG. 5 is purely exemplary, and can be implemented in many different ways. For example, in the bitstream of FIG. 5 all of the configuration data for the digital circuits is provided before any of the data is provided for the analog circuits. In some embodiments, the analog data is interspersed among the digital data. In these embodiments, once the unlock command has been detected, the configuration control logic returns to the standard configuration mode (e.g., in which all configuration data is written to the circuitry of the device) until another code key is detected.

Note that a typical programmable IC includes much more digital circuitry than analog circuitry. Therefore, in embodiments where the process specific configuration data is provided only for analog circuitry, and not for digital circuitry, only a relatively small proportion of the configuration bitstream requires the inclusion of multiple data sets in the configuration bitstream.

In the pictured embodiment, three different code keys are provided, e.g., representing the process corners for the programmable IC. These code keys can represent, for example, the slow, typical, and fast process corners for the programmable IC. In other embodiments, other numbers of code keys are provided, and/or the code keys can represent other process designations for the IC.

In one embodiment, each code key includes two bits of data directed to each type of transistor in the IC. These two bits of data separately identify a slow, typical, or fast process corner for each type of transistor in the IC. These transistor types can include, for example: thick oxide transistors, N-channel and/or P-channel; thin oxide transistors, N-channel and/or P-channel; mid-oxide transistors, N-channel and/or P-channel; low-threshold transistors, N-channel and/or P-channel, low threshold/thin oxide transistors, N-channel and/or P-channel; and so forth. The process corners for other types of structures can also be stored in the non-volatile memory and included in the code keys. For example, a process corner for polysilicon resistors can be included.

In some embodiments, each code key is unique to one mask revision. For example, it is not uncommon for mask sets to be revised to compensate for process variations. In these circumstances, a configuration bitstream can include different sets of configuration data for the analog circuitry of the programmable IC, based on which mask revision is used to fabricate the IC. Using known processes, a customer must manually enter a "stepping number" that identifies the mask revision to the software that generates the configuration bitstream. When the present invention is applied, this manual step can be avoided.

In some embodiments, each code key is unique to one mask revision, although the mask revision is made for purposes other than compensating for process variations. For example, a mask revision might be made to correct an error in the IC hardware, and the mask revision might require a change to the configuration data, e.g., changes to the usage of certain data bits, and/or the values of the data bits. In this situation, the circuits and methods described herein can be used to automatically compensate for the mask revision, as previously described.

Figure 6:
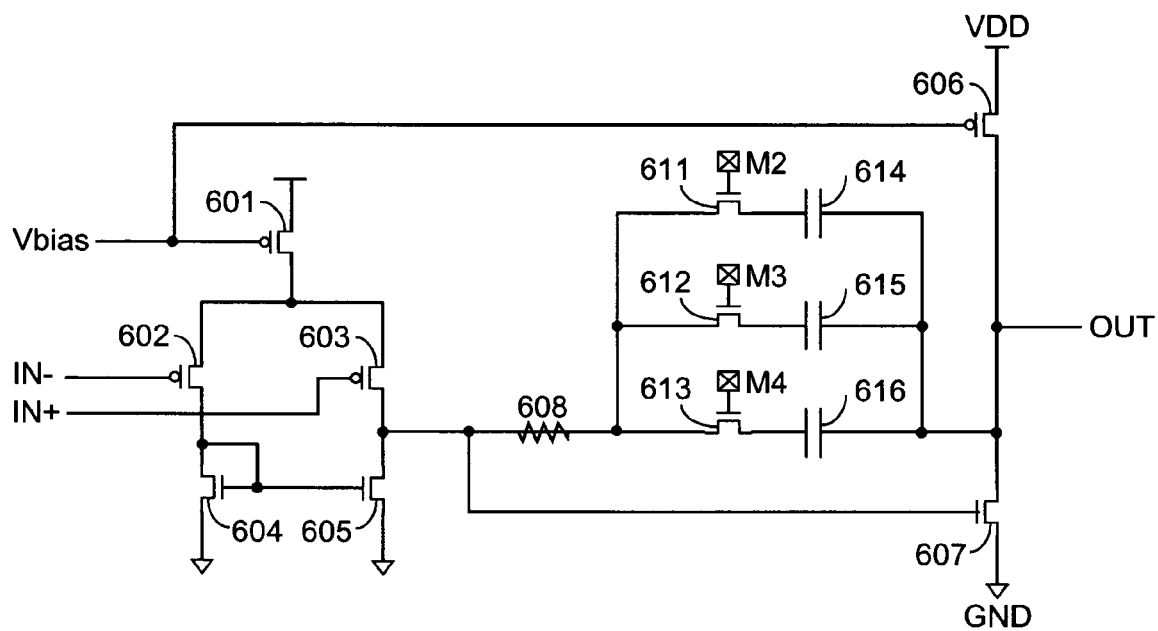
FIG. 6 illustrates a programmable operational amplifier that can be used, for example, with the present invention.

FIG. 6 illustrates another exemplary analog circuit that can be used to implement the circuits and methods of the present invention. The circuit of FIG. 6 is a programmable operational amplifier (op-amp) that can be driven, for example, by bias generator 210 of FIG. 2 or programmable bias generator 310 of FIG. 3. In the op-amp of FIG. 6, the compensation capacitance is programmable using values stored in configuration memory cells (M2-M4). The compensation capacitor network (614-616) prevents the op-amp from being unstable by reducing the gain above a certain frequency where the phase margin goes to zero. The frequency where gain reduction starts is set by the high-pass filter created by the resistor (608) and the capacitor network (614-616). The capacitor network is created from transistors whose gate capacitance can vary widely with variations in the fabrication process. Thus, it is desirable to have the ability to tune the capacitance of the op-amp depending on the process corner, in order to have control over the frequency at which gain reduction is applied.

The op-amp of FIG. 6 includes P-channel transistors 601-603 and 606; N-channel transistors 604-605, 607, and 611-613; resistor 608; capacitors 614-616; and configuration memory cells M2-M4, coupled together as shown in FIG. 6. Transistors 601-605 implement a standard op-amp circuit controlled by bias voltage Vbias, which can be generated, for example, by bias generator circuit 210 (see FIG. 2) or 310 (see FIG. 3), or by some other source. This standard op-amp circuit drives a high-pass filter (elements 608 and 611-616) and an output circuit (transistors 606-607), which provides the op-amp output signal OUT.

Note that FIGS. 3 and 6 merely provide exemplary programmable analog circuits that can be used to take advantage of the circuits and methods of the present invention. As noted above, the programmable circuits applicable to the invention can include, but are not limited to, any of the following: bias generator circuits, bandgap circuits, CML buffers, operational amplifiers, voltage reference circuits, voltage regulator circuits, differential to single-ended converter circuits, and memory cell read/write circuits. It will be clear to those of skill in the art that many other types of circuits are also suitable for implementation of the present invention.

Figure 7:
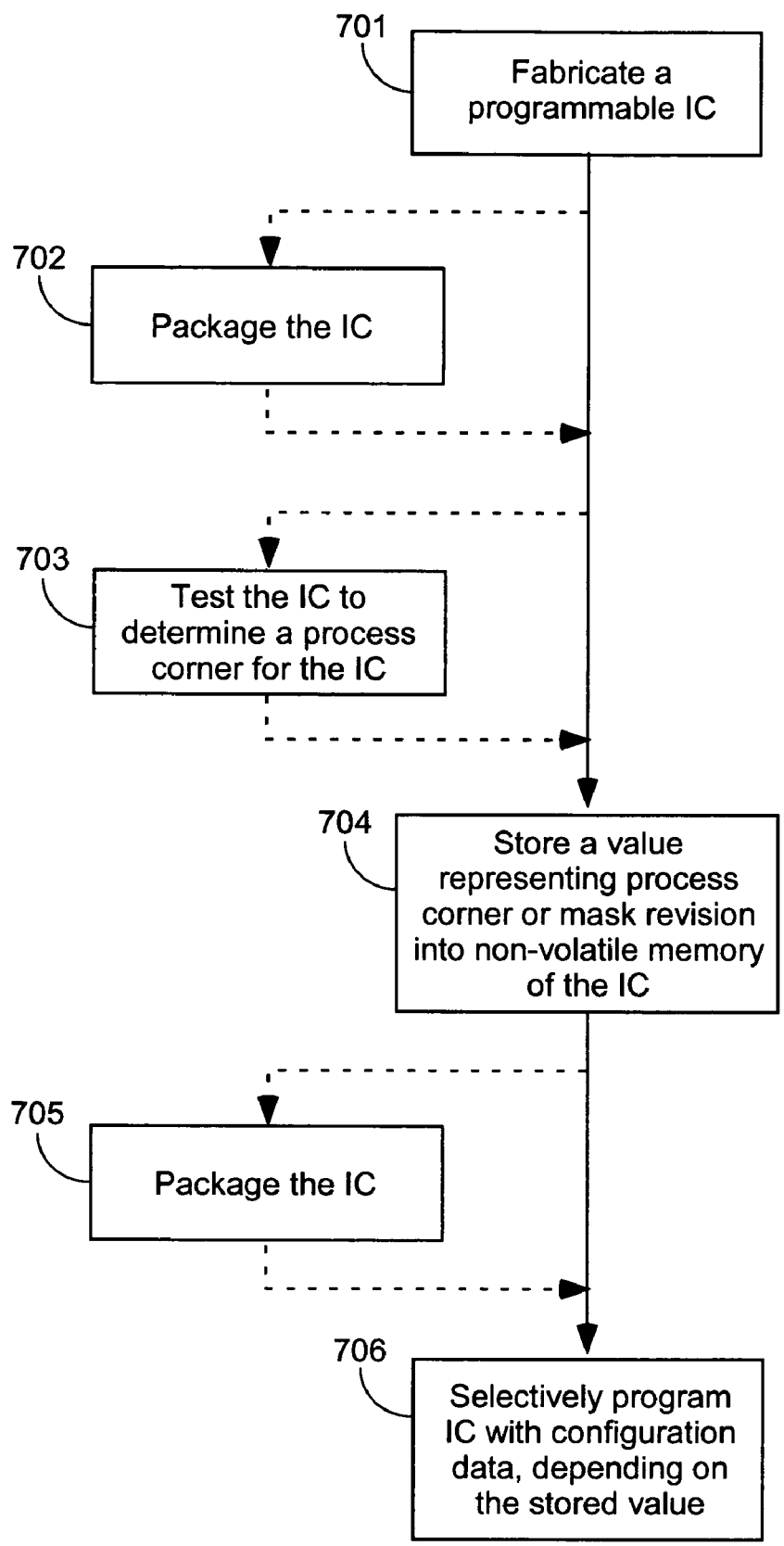
FIG. 7 illustrates the steps of an exemplary method of compensating for process variation and/or mask revision in a programmable IC.

FIG. 7 illustrates the steps of an exemplary method of compensating for process variations and/or mask revisions in a programmable IC. This method can be practiced, for example, using the exemplary circuits of FIGS. 3-4 and 6 and/or the exemplary configuration bitstream of FIG. 5. However, the method can also be practiced using other circuits and other bitstreams, e.g., using the variations described above in conjunction with these figures. It will be apparent to those of skill in the art that the illustrated methods can be practiced within these and other architectural variations.

In step 701, the programmable IC is fabricated. In optional step 702, the IC is packaged. Step 702 is optional because the IC can be packaged at this point in the process, or later in the process (e.g., in optional step 705).

In optional step 703, the programmable IC is tested to determine a process corner for the IC. These process corners can be, for example, slow, typical, and fast, or can use some other categories as desired. The same process corner can be applied to all devices on the IC, or different process corner information can be determined for different types of structures (e.g., transistors, polysilicon resistors, etc.) on the IC.

In step 704, a value is stored in a non-volatile memory included in the programmable IC. If the programmable IC was tested as shown in step 703, then the value stored in the non-volatile memory can represent, for example, the process corner determined in step 703. In other embodiments, the value stored in the non-volatile memory represents a mask revision for the programmable IC, e.g., a mask revision that affects the functionality of some of the circuits in the IC, such as the analog circuitry. In these embodiments, step 703 can be omitted, or can represent simply the usual testing performed on an IC as part of the manufacturing process. In some embodiments, the stored value includes information regarding both process corner and mask revision. In other embodiments, the stored value includes other information regarding the programmable IC, instead of or in addition to the process corner and mask revision information.

As previously noted, the IC can be packaged before testing (step 702) or after the value is stored in the non-volatile memory, as indicated in optional step 705. In some embodiments (not shown), the IC is packaged after testing and prior to storing the value in the non-volatile memory.

In step 606, the IC is selectively programmed with configuration data such as a configuration data bitstream. The programming is selective, because the choice of configuration data used to program the IC depends on the value stored in the non-volatile memory in step 704.

Figure 8:
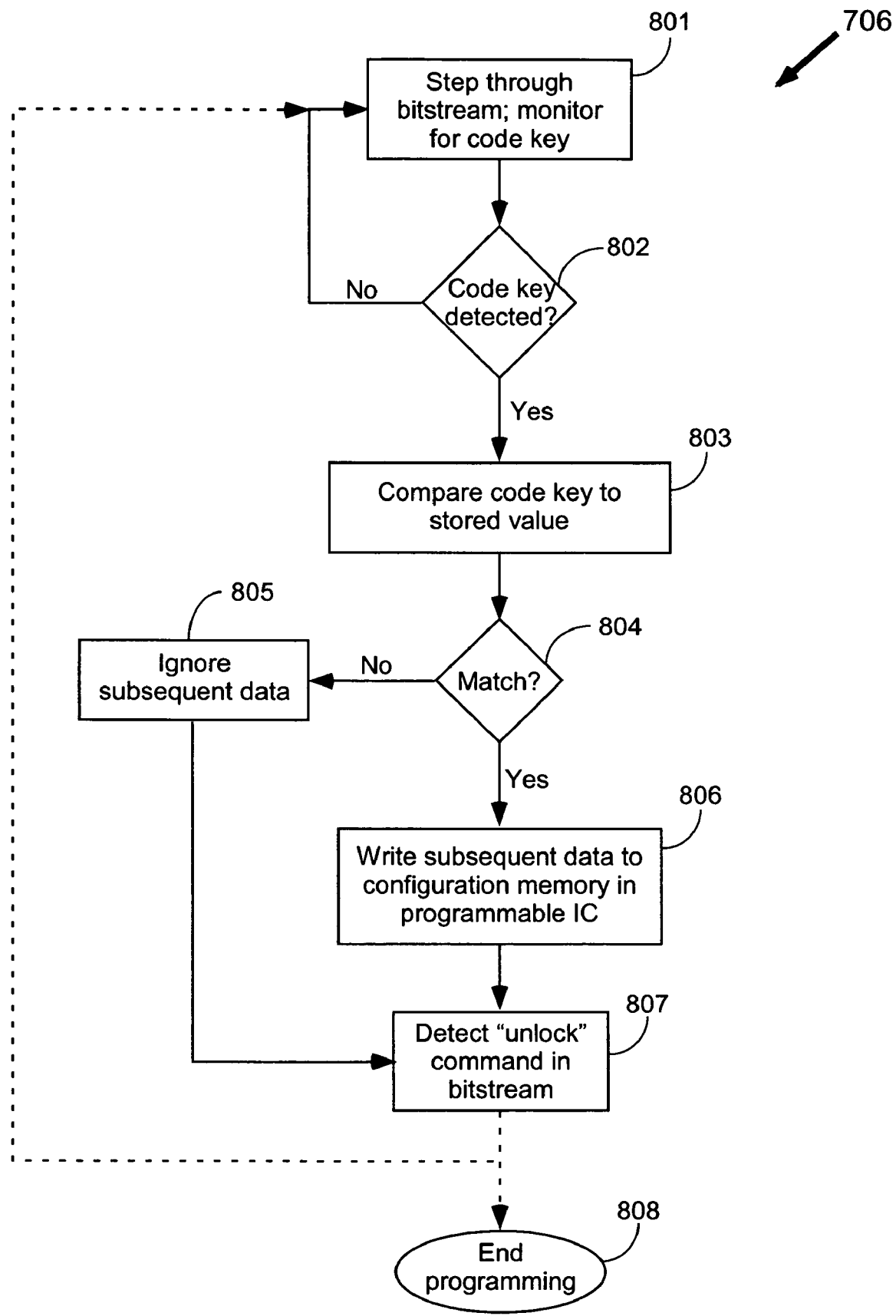
FIG. 8 illustrates further details of one of the steps in the method of FIG. 6.

FIG. 8 illustrates in more detail the sequence of events effecting the selective programming of step 706, according to some embodiments of the invention. In step 801, during a programming process for the programmable IC, the configuration bitstream is monitored for the occurrence of a code key. In decision step 802, as long as no code key is detected, the bitstream is handled in a standard manner. For example, configuration control logic might continue to write configuration data into first programmable logic as long as no code key is detected. In step 803, once a code key is detected, the code key is compared to the value stored in non-volatile memory of the programmable IC (e.g., in step 704 of FIG. 7). In decision step 804, as long as no match occurs, the subsequent configuration data is ignored (step 805) until a predetermined command (e.g., an "unlock" command) is detected in the configuration bitstream (step 807). However, if the code key matches the value stored in the non-volatile memory, subsequent data from the configuration bitstream is written to a configuration memory in the programmable IC (step 806). For example, once a match is detected, the configuration control logic might begin to write configuration data into second programmable logic in the IC. At step 807, the predetermined command is detected in the configuration bitstream.

After step 807, in some embodiments the configuration control logic continues to step through the bitstream until the end of the bitstream is reached. In other words, standard processing of the bitstream resumes until and unless another code key is detected (e.g., the method returns to step 801). In other embodiments, the process-selective configuration data is provided only at the end of the configuration bitstream, as shown in the bitstream of FIG. 5. In some of these embodiments, the first unlock command that is detected is interpreted as a signal that the configuration process is complete (step 808).

Those having skill in the relevant arts of the invention will now perceive various modifications and additions that can be made as a result of the disclosure herein. For example, non-volatile memories, E-fuse structures, E-fuses, pull-ups, pull-downs, transistors, P-channel transistors, N-channel transistors, mid-oxide transistors, low-threshold transistors, configuration control circuits, CML buffers, bias generator circuits, CML buffers, operational amplifiers, digital circuits, analog circuits, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A method of compensating for process variation in a programmable integrated circuit (IC), the method comprising:

testing the IC to determine a process corner for the programmable IC;

storing into a non-volatile memory of the programmable IC a value representing the process corner determined during the testing;

comparing the value representing the process corner stored in the non-volatile memory to first and second code keys in a configuration bitstream that is input to the programmable IC, the first code key being different from the second code key;

programming the programmable IC with a first set of configuration data from the configuration bitstream in response to the value matching the first code key; and programming the programmable IC with a second set of configuration data from the configuration bitstream in response to the value matching the second code key.

2. The method of claim 1, further comprising packaging the programmable IC prior to the testing the programmable IC to determine the process corner for the programmable IC.

3. The method of claim 1, further comprising packaging the programmable IC after the storing into the non-volatile memory and prior to the selectively programming the programmable IC.

4. The method of claim 1, further comprising:

monitoring, during a programming process for the programmable IC, the configuration bitstream for the first and second code keys;

wherein the programming with the first set of configuration data includes writing, when the first code key matches the value, first subsequent data from the configuration bitstream to a configuration memory in the programmable IC;

ignoring the first subsequent data when the first code key does not match the value;

wherein the programming with the second set of configuration data includes writing, when the second code key matches the value, second subsequent data from the configuration bitstream to a configuration memory in the programmable IC;

ignoring the second subsequent data when the second code key does not match the value; and detecting a predetermined command in the configuration bitstream that indicates a break point in the first and second subsequent data.

5. The method of claim 4, further comprising:

resuming, after detecting the predetermined command, the programming process for the programmable IC.

6. The method of claim 1, wherein the storing comprises blowing at least one E-fuse in the programmable IC.

7. The method of claim 1, wherein the storing comprises writing the value into a circuit selected from a list consisting of: an E-fuse register; a PROM cell; an EPROM cell; an EEPROM cell; and a FLASH memory cell.

8. The method of claim 1, further comprising:

generating an internal bias voltage for a circuit in the programmable IC, wherein a value of the internal bias voltage is based on the one of the first set and the second set of configuration data.

9. A method of programming a programmable integrated circuit (IC), the method comprising:

storing a value into a non-volatile memory of the programmable IC;

comparing the value stored in the non-volatile memory to first and second code keys in a configuration bitstream that is input to the programmable IC, the first code key being different from the second code key;

programming the programmable IC with a first set of configuration data from the configuration bitstream in response to the value matching the first code key; and programming the programmable IC with a second set of configuration data from the configuration bitstream in response to the value matching the second code key.

10. The method of claim 9, wherein the value represents a process corner for the programmable IC.

11. The method of claim 10, wherein the value represents one of three supported values, the three supported values comprising slow, typical, and fast process corners for the programmable IC.

12. The method of claim 10, wherein the value represents a plurality of process corners for the programmable IC, each of the plurality of process corners being applicable to a different structure in the programmable IC.

13. The method of claim 12, wherein the plurality of process corners are applicable to transistors having different oxide thicknesses.

14. The method of claim 12, wherein the plurality of process corners are applicable to transistors having different threshold voltages.

15. The method of claim 9, wherein the value represents a mask revision for the programmable IC.

16. The method of claim 9, further comprising packaging the programmable IC.

17. The method of claim 9, further comprising monitoring, during a programming process for the programmable IC, the configuration bitstream for the first and second code keys;

wherein the programming with the first set of configuration data includes writing, when the first code key matches the value, first subsequent data from the configuration bitstream to a configuration memory in the programmable IC;

ignoring the first subsequent data when the first code key does not match the value;

wherein the programming with the second set of configuration data includes writing, when the second code key matches the value, second subsequent data from the configuration bitstream to a configuration memory in the programmable IC;

ignoring the second subsequent data when the second code key does not match the value; and detecting a predetermined command in the configuration bitstream that indicates a break point in the first and second subsequent data.

18. The method of claim 17, further comprising:

resuming, after detecting the predetermined command, the programming process for the programmable IC.

19. The method of claim 9, wherein the storing comprises blowing at least one E-fuse in the programmable IC.

20. The method of claim 9, wherein the storing comprises writing the value into a circuit selected from a list consisting of: an E-fuse register; a PROM cell; an EPROM cell; an EEPROM cell; and a FLASH memory cell.

* * * * *